(12) United States Patent
Chang

(10) Patent No.: US 6,661,276 B1
(45) Date of Patent: Dec. 9, 2003

(54) MOSFET DRIVER MATCHING CIRCUIT FOR AN ENHANCEMENT MODE JFET

(75) Inventor: Daniel Chang, Fremont, CA (US)

(73) Assignee: Lovoltech Inc., Santa Clara, CA (US)

( * ) Notice: Subject to any disclaimer, the term of this patent is extended or adjusted under 35 U.S.C. 154(b) by 0 days.

(21) Appl. No.: 10/209,211

(22) Filed: Jul. 29, 2002

(51) Int. Cl.[7] .......................................... H03K 17/687
(52) U.S. Cl. ........................................ 327/427; 327/430
(58) Field of Search ................................. 327/430, 427, 327/431, 434, 437, 108, 110; 333/81 R

(56) References Cited

U.S. PATENT DOCUMENTS

| | | | | |
|---|---|---|---|---|
| 4,054,805 A | * | 10/1977 | Stebbins ...................... | 327/430 |
| 4,323,799 A | * | 4/1982 | King et al. .................. | 327/394 |
| 4,352,207 A | * | 9/1982 | Cross et al. ................. | 455/223 |
| 5,051,629 A | * | 9/1991 | Hopkins ....................... | 327/276 |
| 5,528,721 A | * | 6/1996 | Searcy et al. ............... | 388/824 |
| 5,671,131 A | * | 9/1997 | Brown ......................... | 363/49 |
| 5,900,765 A | * | 5/1999 | Kawasaki et al. .......... | 327/362 |
| 5,936,360 A | * | 8/1999 | Kaneko ....................... | 315/307 |
| 6,054,824 A | * | 4/2000 | Hsieh .......................... | 318/445 |

OTHER PUBLICATIONS

Ochi (US2002/0047743) Apr. 25, 2002.*

* cited by examiner

Primary Examiner—Tuan T. Lam
(74) Attorney, Agent, or Firm—Wagner, Murabito & Hao LLP

(57) ABSTRACT

A matching circuit for coupling a conventional metal-oxide semiconductor field effect transistor (MOSFET) driver to the gate of a junction field effect transistor (JFET). A driver circuit optimized for driving a MOSFET is combined with a matching circuit to provide gate drive for a JFET. The matching circuit comprises a resistor and capacitor in parallel. For driving enhancement mode JFETs having a gate grid array structure and a pinch-off voltage greater than 0.4 volts, the range of resistor values is 10 to 200 ohms, and the range of capacitor values is 1 to 100 nF. For devices having a pinch-off voltage less than 0.4 volts, the range of resistor values is 100 to 2000 ohms. The matching circuit may further include a diode to provide a bias.

22 Claims, 9 Drawing Sheets

MOSFET DRIVER MATCHING CIRCUIT FOR AN ENHANCEMENT MODE JFET

FIELD OF THE INVENTION

Embodiments of the present invention relate to the field of junction field effect transistors (JFETs). In particular, embodiments of the present invention relate to gate drive circuits for JFETs.

BACKGROUND ART

Junction field effect transistors (JFETs) are majority carrier devices that conduct current through a channel that is controlled by the application of a voltage to a p-n junction. JFETs may be constructed as p-channel or n-channel and may be operated as enhancement mode devices or depletion mode devices.

The most common JFET type is the depletion mode type. The depletion mode device is a "normally on" device that is turned off by reverse biasing the p-n junction so that pinch-off occurs in the conduction channel. P-channel depletion mode devices are turned off by the application of a positive voltage between the gate and source (positive $V_{gs}$), whereas n-channel depletion mode devices are turned off by the application of a negative voltage between the gate and source (negative $V_{gs}$). Since the junction of a depletion mode JFET is reverse biased in normal operation, the input voltage $V_{gs}$, can be relatively high. However, the supply voltage between the drain and source ($V_{ds}$) is usually relatively low.

Prior Art FIG. 1A shows a general schematic for an n-channel depletion mode JFET with $V_{gs}=V_{ds}=0$. The JFET has two opposed gate regions 10, a drain 11 and source 12. The drain 11 and source 12 are located in the n-doped region of the device and the gates 10 are p-doped. Two p-n junctions are present in the device, each having an associated depletion region 13. A conductive channel region 14 is shown between the two depletion regions 13 associated with the p-n junctions.

In operation, the voltage variable width of the depletion regions 13 is used to control the effective cross-sectional area the of conductive channel region 14. The application of a voltage $V_{gs}$ between the gates 10 and source 12 will cause the conductive channel region to vary in width, thereby controlling the resistance between the drain 11 and the source 12. A reverse bias, (e.g., a negative $V_{gs}$), will cause the depletion regions to expand, and at a sufficiently negative value cause the conductive channel to "pinch off", thereby turning off the device.

The width of the depletion regions 13 and the conductive channel region 14 are determined by the width of the n-doped region and the dopant levels in the n-doped and p-doped regions. If the device shown in FIG. 1A were constructed with a narrow n-doped region, such that the two depletion regions merged into a single continuous depletion region and the conductive channel region 14 had zero width, the result would be the device shown in FIG. 1B.

Enhancement mode, or "normally off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. P-channel enhancement mode JFETs are turned on by the application of a negative $V_{gs}$, and n-channel enhancement mode JFETs are turned on by the application of a positive $V_{gs}$. The input voltage of an enhancement mode JFET is limited by the forward voltage of the p-n junction.

Prior Art FIG. 1B shows a general schematic of an n-channel enhancement mode JFET with $V_{gs}=V_{ds}=0$. The enhancement mode device is "normally off" since the conductive channel width is zero due to the extent of the two depletion regions 13B. The application of a sufficient forward bias (e.g. positive $V_{gs}$) to the device of FIG. 1B will cause the depletion regions 13B to contract, thereby opening a conductive channel.

Although the depletion mode and enhancement mode devices shown schematically in FIG. 1A and FIG. 1B are n-channel devices, depletion mode and enhancement mode devices could be constructed with a reversed doping scheme to provide p-channel devices.

Historically, metal-oxide semiconductor field effect transistors (MOSFETs) have been much more widely used than JFETs; and among JFETs, the depletion mode device has been more widely used than the enhancement mode device. However, the adoption of submicron processes for device fabrication and the resulting higher speeds, lower voltages, and greater current demands in integrated circuits has created new opportunities for the application of JFETs in power conditioning circuits such as buck converters and switching power supplies.

switching mode regulators are preferred to linear devices due to their greater efficiency. This increased efficiency is achieved by operating the switch (transistor) so that it is either fully on or fully off. Circuits used to drive a transistor for a switching application are designed with the goal of providing a fast transition between the "on" and "off" states of the transistor switch.

JFETs are capable of being driven by low voltages while maintaining excellent breakdown characteristics when compared to MOSFETs. Since there is no insulator associated with gate/drain and gate/source interfaces of a JFET (only a p-n junction), forward bias results in conduction at voltages that are very low compared to the reverse bias that the device is capable of withstanding. JFETs also have a much greater resistance to damage from electrostatic discharge (ESD) than MOSFETs.

As a result of the widespread use of MOSFET devices, driver circuits and circuit designs for MOSFETs are readily available with a relatively low cost. However, due to the fundamental differences between MOSFETs and JFETs, these conventional MOSFET drivers are not well suited for driving JFETs.

SUMMARY OF INVENTION

Accordingly, a matching circuit for coupling a conventional metal-oxide semiconductor field effect transistor (MOSFET) driver to the gate of an enhancement mode junction field effect transistor (JFET)is described herein. A driver circuit optimized for driving a MOSFET is combined with a matching circuit to provide gate drive for a JFET.

More specifically, in an embodiment of the present invention, a matching circuit comprising a capacitor and a resistor in parallel is used to couple the output of a conventional MOSFET driver to the gate of an enhancement mode JFET.

In another embodiment of the present invention, particular values of resistance and capacitance are used in matching a conventional MOSFET driver to a JFET with a gate grid array structure. For driving enhancement mode JFETs having a gate grid array structure, the range of resistor values may be from 10 to 200 ohms, and the range of capacitor values may be from 1 to 100 nF, in one example. For devices having a low pinch-off voltage (e.g., a pinch-off voltage less than 0.4 volts), a preferred range of resistor values is 100 to 2000 ohms.

In a further embodiment, a diode or a plurality of diodes is coupled in series with the resistor of the matching circuit described above, in order to provide a gate bias for the JFET.

The present invention has the advantage of enabling common MOSFET drivers to be used to be used as enhancement mode JFET drivers. The invention also has the advantage of simplifying drive requirements in circuits having both JFETs and MOSFETs, by using a common driver for both transistor types.

BRIEF DESCRIPTION OF THE DRAWINGS

Prior Art

Prior Art

DESCRIPTION OF THE PREFERRED EMBODIMENTS

In the following detailed description of the present invention, a matching circuit for coupling a MOSFET driver to a JFET, numerous specific details are set forth in order to provide a thorough understanding of the present invention. However, it will be obvious to one skilled in the art that the present invention may be practiced without these specific details. In other instances well known circuits and components have not been described in detail so as not to unnecessarily obscure aspects of the present invention.

U.S. Pat. No. 6,251,716 entitled "JFET Structure and Manufacture Method for Low On-Resistance and Low Voltage Application," issued Jun. 26, 2001, and assigned to the assignee of the present invention, is hereby incorporated herein by reference. The referenced patent describes material regarding an enhancement mode JFET with a gate grid array structure.

Figure 1A:
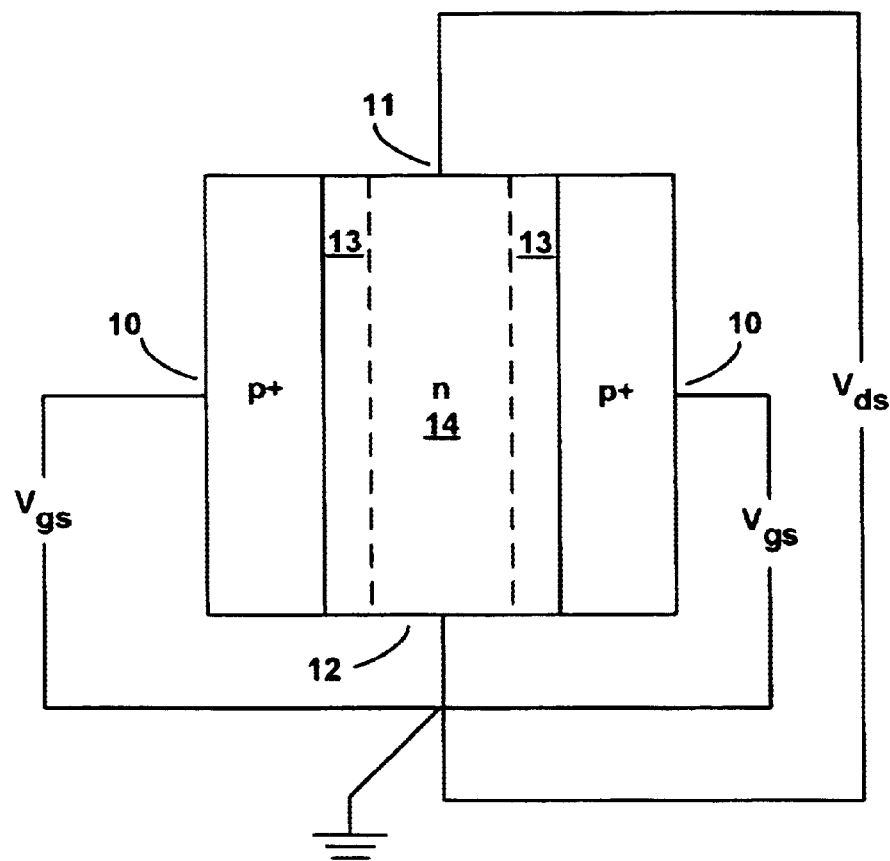
FIG. 1A shows a general schematic for an n-channel depletion mode junction field effect transistor (JFET).
Figure 1B:
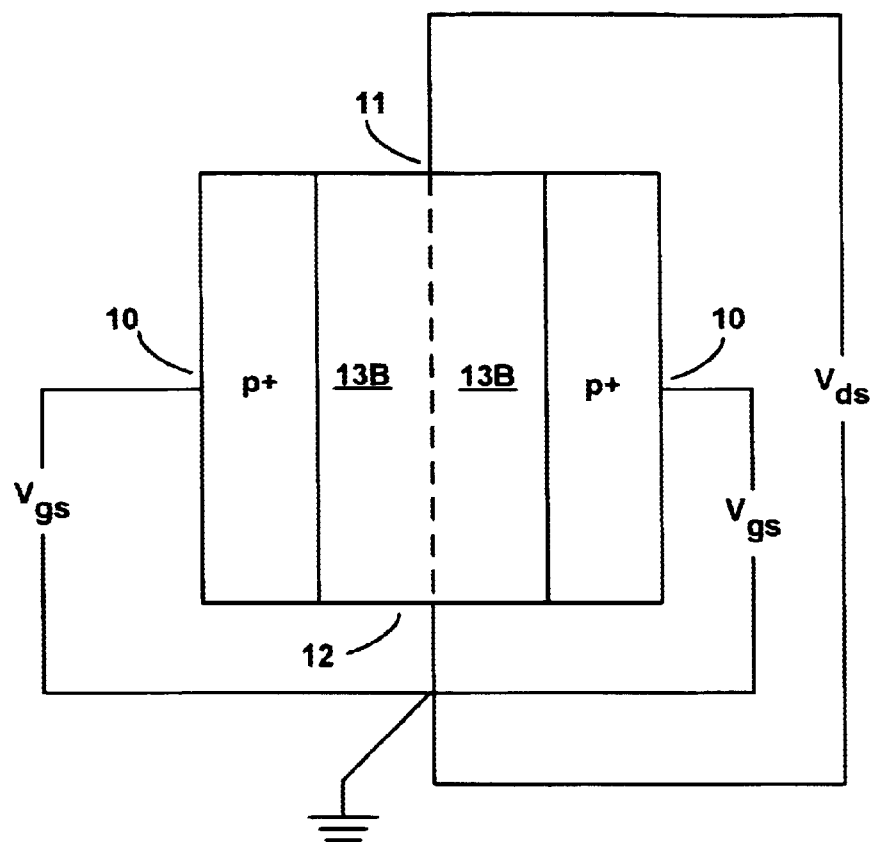
FIG. 1B shows a general schematic for an n-channel enhancement mode junction field effect transistor (JFET).
Figure 2A:
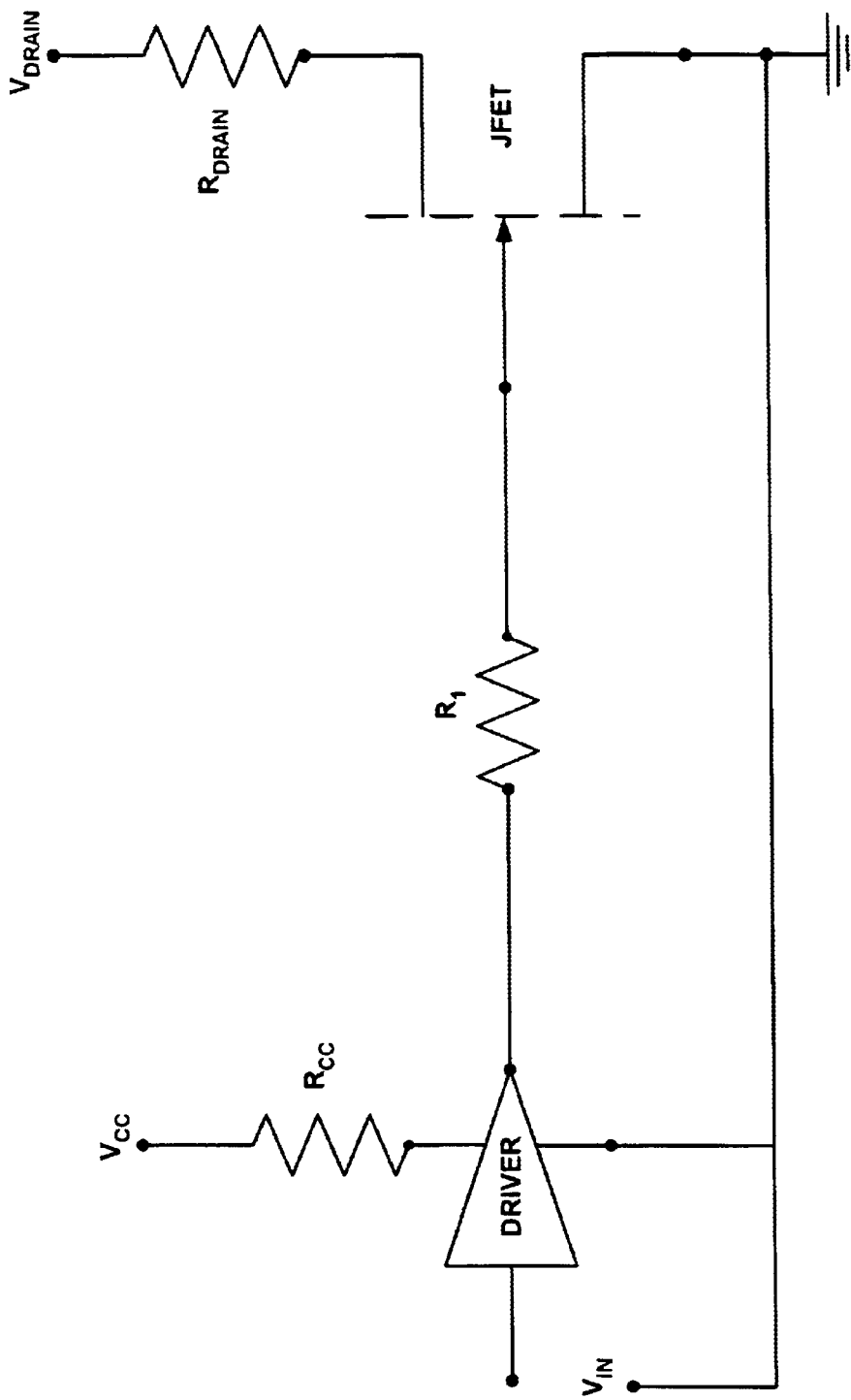
FIG. 2A shows a circuit schematic with a JFET and a MOSFET driver without a matching circuit.

FIG. 2A shows a circuit schematic 210 with a JFET 205 and a MOSFET driver 206 without a matching circuit. The output of the MOSFET driver is coupled directly to the input of the JFET 205. The circuit has six nodes numbered 1 through 6. A voltage $V_{cc}$ for the MOSFET driver 206 is coupled to node 3, and a resistor $R_{cc}$ representing the internal resistance of the supply is connected between node 2 and node 3. Node 2 is also connected to the supply input for the MOSFET driver 206. The driver 206 is also connected to an input signal voltage source $V_{IN}$ at node one, and to ground at node 0. The output of the driver 206 is connected to node 6, as is the gate of the JFET 205. A supply voltage $V_{drain}$ is connected to node 5, and a resistor $R_{drain}$ representing the internal resistance of the $V_{drain}$ supply is connected between node 4 and node 5. Node 4 is coupled to the drain of the JFET 205, and the source of the JFET 205 is coupled to ground at node 0.

Table 1 shows a PSpice model for a first JFET LVTEA132i. The JFET LVTEA132i is an enhancement mode JFET. Table 2 Shows a PSpice model for a second JFET LVTEC219i. The JFET LVTEC219i is also an enhancement mode device. The two JFETs modeled in Table 1 and Table 2 are examples of JFETs that have a gate grid array structure. Table 3 shows a PSpice model for an ELANTEC M7212 MOSFET driver. The M7212 is an example of a conventional MOSFET driver.

TABLE 1

.SUBCKT LVTEA132i 1 4 5
JX3 1 3 2 LVTEA132bb
RX1 6 3 0.23143355
CX1 1 2 5PF
LXs 2 5 0.75NH
LXg 4 6 1.15NH
DgsX 3 2 LVTGSdiodeaa
DgdX 3 1 LVTGDdiodeaa
.model LVTEA132bb NJF(Beta=163 Betatce=−.5 Rd=.001 Rs=.001
Lambda=1.7
Vto=.534 Vtotc=−2.5m Is=35.3p Isr=322.4f N=1.731
+Nr=2 Xti=3 Alpha=311.7u Vk=243.6 Cgd=832p M=.3622 Pb=0.82
Fc=.5
Cgs=998p Kf=9.882E-18 Af=1)
.model LVTGSdiodeaa D IS=2.33E-9 N=1.82 CJO=1.0000E-12 M=.3622
VJ=.82
ISR=322.40E-15 BV=100 IBV=100.00E-6 TT=5.0000E-9
.MODEL LVTGDdiodeaa D IS=4.66E-9 N=1.82 CJO=1.0000E-12
M=.3622
VJ=.82
ISR=322.40E-15 BV=100 IBV=100.00E-6 TT=5.0000E-9
.ENDS

TABLE 2

.SUBCKT LVTEC219i 1 4 5
JX3 1 3 2 LVTEC219bb
RX1 6 3 0.256423
CX1 1 2 10PF
LXs 2 5 0.75NH
LXg 4 6 1.15NH
DgsX 3 2 LVTGSdiodebb
DgdX 3 1 LVTGDdiodebb
.model LVTEC219bb NJF(Beta=400 Betatce=−.5 Rd=.0003 Rs=.0017
Lambda=2.479 Vto=.4177 Vtotc=−2.5m Is=0.043n Isr=322.4f N=1.82
+Nr=2 Xti=3 Alpha=311.7u Vk=243.6 Cgd=2247p M=.3622 Pb=0.88
Fc=.5
Cgs=2629p Kf=9.882E-18 Af=1)
.MODEL LVTGSdiodebb D IS=2.343E-9 N=1.82 CJO=1.0000E-12
M=.3622 VJ=.82
ISR=322.40E-15 BV=100 IBV=100.00E-6 TT=5.0000E-9
.MODEL LVTGDdiodebb D IS=18.343E-9 N=1.82 CJO=1.0000E-12
M=.3622 VJ=.82
ISR=322.40E-15 BV=100 IBV=100.00E-6 TT=5.0000E-9
.ENDS

TABLE 3

.subckt M7212/EL   2   3   6   7
V1 12 3 1.6
R1 13 15 1k
R2 14 15 5k
R5 11 12 100
C1 15 3 43.3pF
D1 14 13 dmod
X1 13 11 2 3 comp1/M7212
X2 16 12 15 3 comp1/M7212
sp 6 7 16 3 spmod TABLE 3-continued

```
sn 7 3 16 3 snmod
g1 11 0 13 0 938u
.model dmod d
.model spmod vswitch ron=3 roff=2meg von=1 voff=1.5
.model snmod vswitch ron=4 roff=2meg von=3 voff=2
.ends
*
.subckt comp1/M7212 out inp inm vss
e1 out vss table {(v(inp)-v(inm))*5000} = (0, 0) (3.2, 3.2)
Rout out vss 10meg
Rinp inp vss 10meg
Rinm inm vss 10meg
.ends
```

Figure 2B:
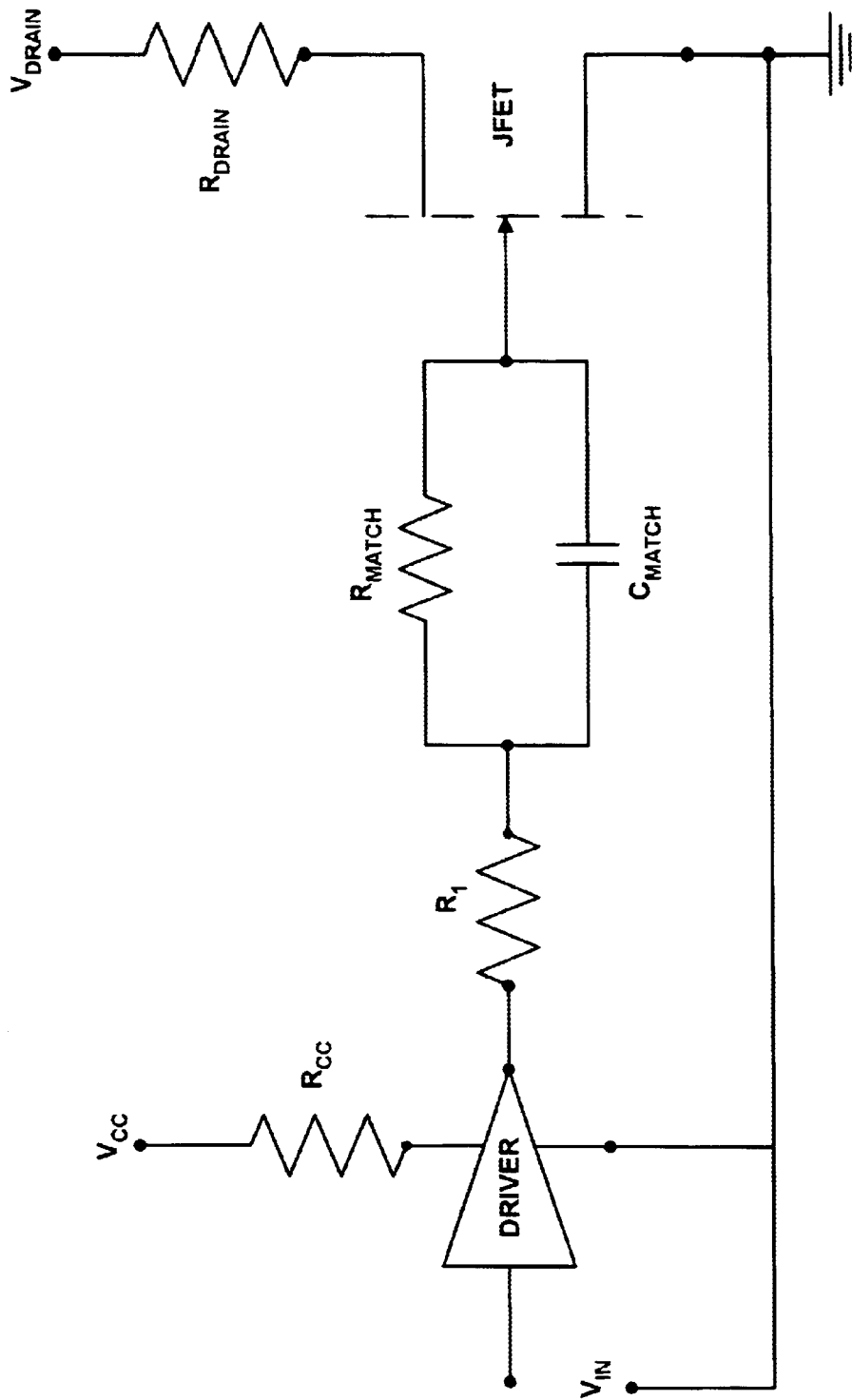
FIG. 2B shows a circuit schematic with a JFET and a MOSFET driver with a matching circuit in accordance with an embodiment of the present claimed invention.

FIG. 2B shows a circuit schematic 220 that is similar to that of FIG. 2A, but with the addition of a matching circuit 225. The matching circuit 225 couples the output of the MOSFET driver 206 to the gate of the JFET 205. The matching circuit 225 has a resistor $R_{match}$ in parallel with a capacitor $C_{match}$. Among the parameters used to determine Rmatch and Cmatch are the operating frequency, duty cycle, JFET capacitance and JFET threshold voltage.

When used in switching applications, a MOSFET presents a load to the driver that is essentially capacitive whether the MOSFET is fully on or fully off. However, an enhancement mode JFET in the off state presents a capacitive load that transitions to a resistive load in the fully on state. The RC network of the present invention enables a conventional MOSFET driver to handle this changing load.

Typical power MOSFETs require a gate voltage ($V_{gs}$) of more than 10 volts in order to be fully turned on. There is a class of MOSFETs that are intended for use with logic level signals, and these devices can be sufficiently turned on with a $V_{gs}$ of about 5 volts. However, enhancement mode JFETs can be fully on at a $V_{gs}$ of less than 1 volt, allowing a MOSFET driver to be used at lower supply voltage than that normally used when driving MOSFETs.

Figure 3A:
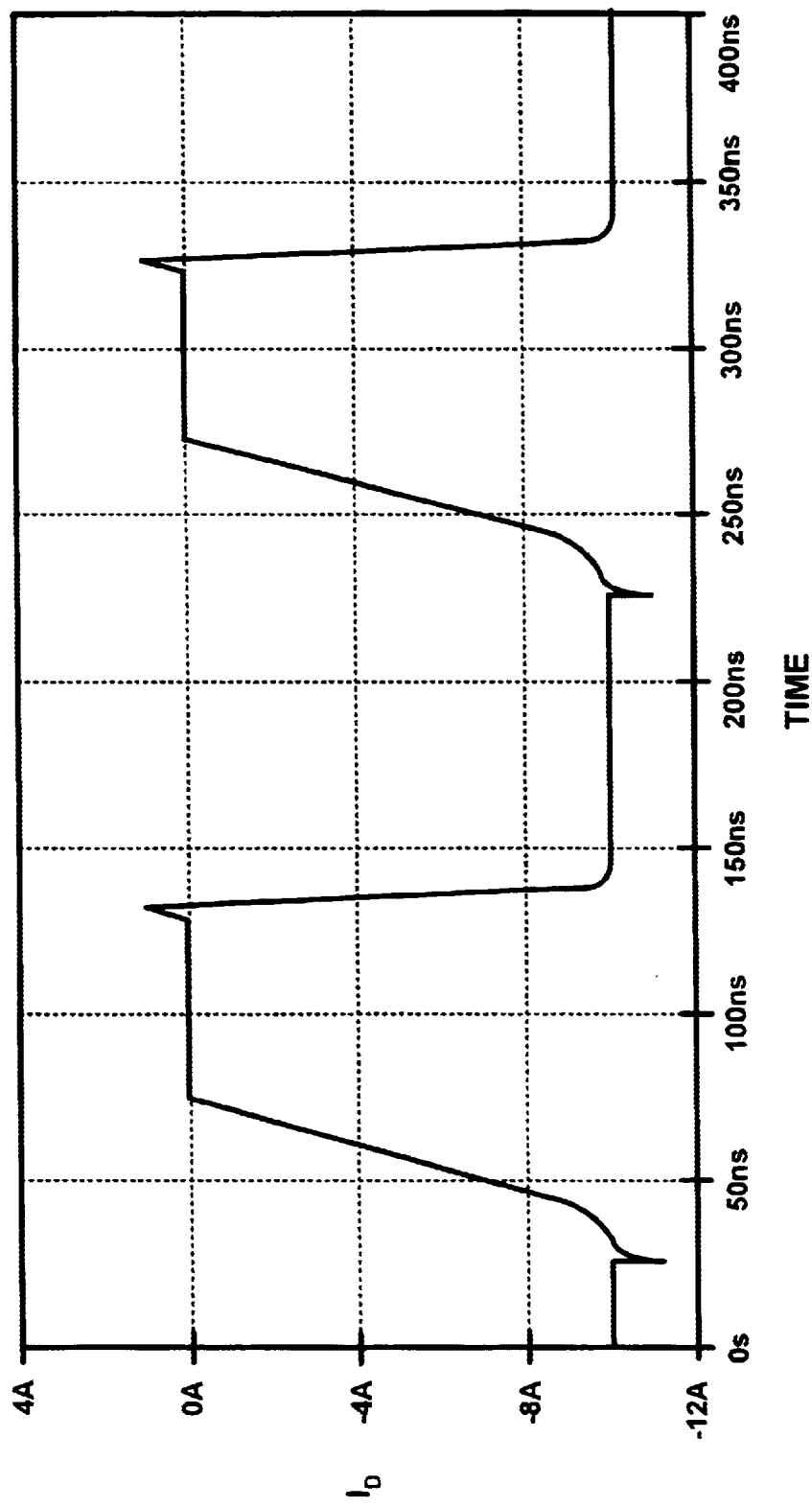
FIG. 3A shows a simulated reference response for a first JFET and MOSFET driver without a matching circuit.

FIG. 3A shows a simulated reference response for a first JFET LVTEA132i and MOSFET driver without a matching circuit. The PSpice model for the circuit of FIG. 2A is shown in Table 4. $V_{IN}$ is essentially a square wave with an amplitude of 5 volts and a frequency of 5 MHz. $V_{drain}$ is 10 volts and $V_{cc}$ is 5 volts. $R_{cc}$ and $R_{drain}$ are both 1 ohm.

TABLE 4

```
VIN         1 0 PULSE(0V 5V 0 .001uS .001uS .1uS .20uS)
Vdrain      5 0 DC 10
Vcc         3 0 DC  5
Rcc         2 3 1
Rdrain      4 5 1
X1          4 6 0 LVTEA132i        ; JFET
X2          1 0 2 6 M7212/EL       ; MOSFET driver
.TRAN 1nS .4DuS
.PROBE
.LIB lvdevs.lib ; Read models from the library
.END
```

As can be seen in FIG. 3A, the drain current $I_D$ has a poor turn on behavior with a relatively long rise time. For applications such as buck converters and switching power supplies, it is desirable to have a short rise time and fall time, in order to minimize the ohmic losses in the switching device (e.g. MOSFET or JFET). Ideally, a switching transistor is driven so that it is either in the "off" state, or the "on state", with very little time spent in between.

Figure 3B:
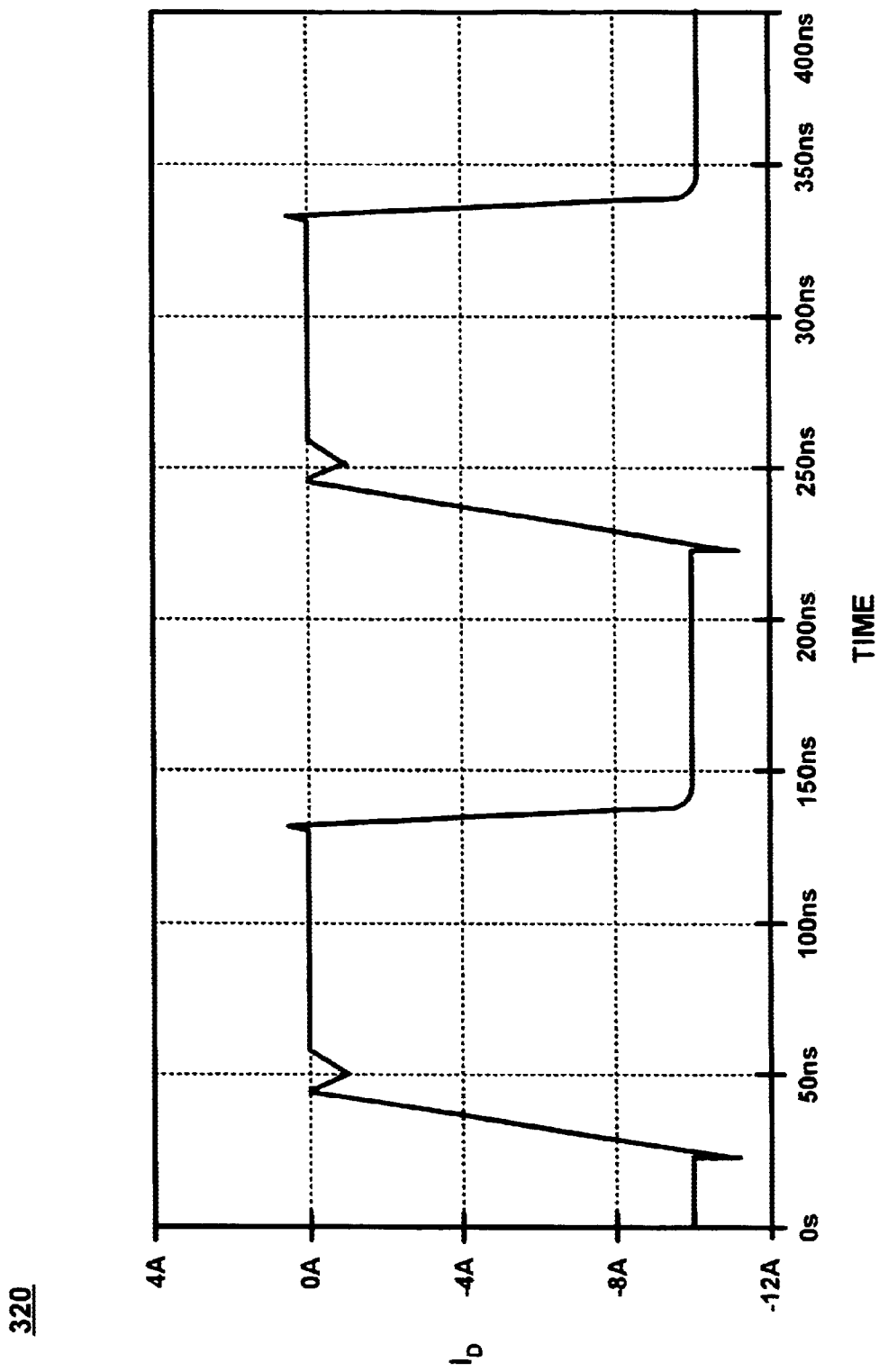
FIG. 3B shows a simulated response for the JFET and MOSFET driver of FIG. 3A with a matching circuit in accordance with an embodiment of the present claimed invention.

FIG. 3B shows a simulated response for the JFET and MOSFET driver of FIG. 3A with an added matching circuit in accordance with an embodiment of the present claimed invention. Table 5 shows a PSpice model for the circuit of FIG. 3B. The general circuit parameters shown in Table 5 are the same as those in Table 4, with the addition of $R_{match}$ with a value of 20 ohms, and $C_{match}$ with a value of 5 nF.

TABLE 5

```
VIN 1 0 PULSE(0V 5V 0 .001uS .001uS .1uS .20uS)
Vdrain      5 0 DC 10
Vcc         3 0 DC  5
Rcc         2 3 1
Rmatch      6 7 20
Rdrain      4 5 1
Cmatch      6 7 5nF
X1          4 6 0 LVTEA132i        ; JFET
X2          1 0 2 7 M7212/EL       ; MOSFET driver
.TRAN 1nS .40uS
.PROBE
.LIB lvdevs.lib ; Read models from the library
.END
```

As can be seen from a comparison of FIG. 3A and 3B, the matching circuit provides a shorter rise time and overall squarer response for the drain current $I_D$. The values for $R_{match}$ and $C_{match}$ associated with the response shown in FIG. 3B are not presented as optimized values, but merely as examples of values that demonstrate the improved JFET response afforded by the matching circuit of the present invention.

Figure 4A:
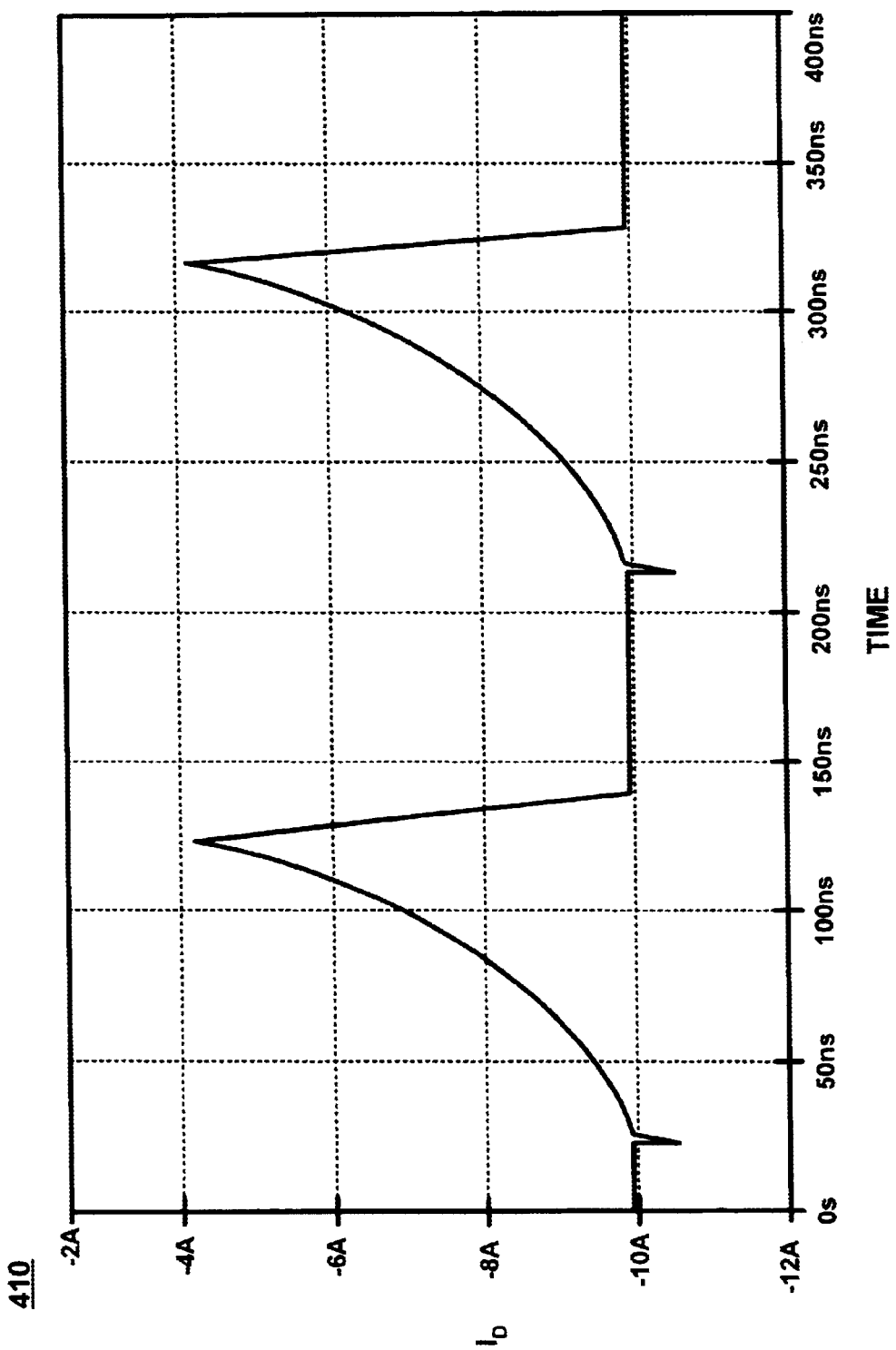
FIG. 4A shows a simulated reference response for a second JFET and MOSFET driver without a matching circuit.

FIG. 4A shows a simulated reference response for a second JFET LVTEC219i and MOSFET driver without a matching circuit. The PSpice model for the circuit of FIG. 2A is shown in Table 6. The circuit configuration associated with the response of FIG. 4A is essentially the same as that of FIG. 3A with the substitution of a second JFET LVTEC219i for the first JFET LVTEA132i. The drain current response shown in FIG. 4A has such a long rise time that it does not even resemble a square wave.

TABLE 6

```
VIN         1 0 PULSE(0V 5V 0 .001uS .001uS .1uS .20uS)
Vdrain      5 0 DC 10
Vcc         3 0 DC  5
Rcc         2 3 1
Rdrain      4 5 1
X1          4 6 0 LVTEc219i        ; JFET
X2          1 0 2 6 M7212/EL       ; MOSFET driver
.TRAN 1nS .40uS
.PROBE
.LIB lvdevs.lib  ; Read models from the library
.END
```

Figure 4B:
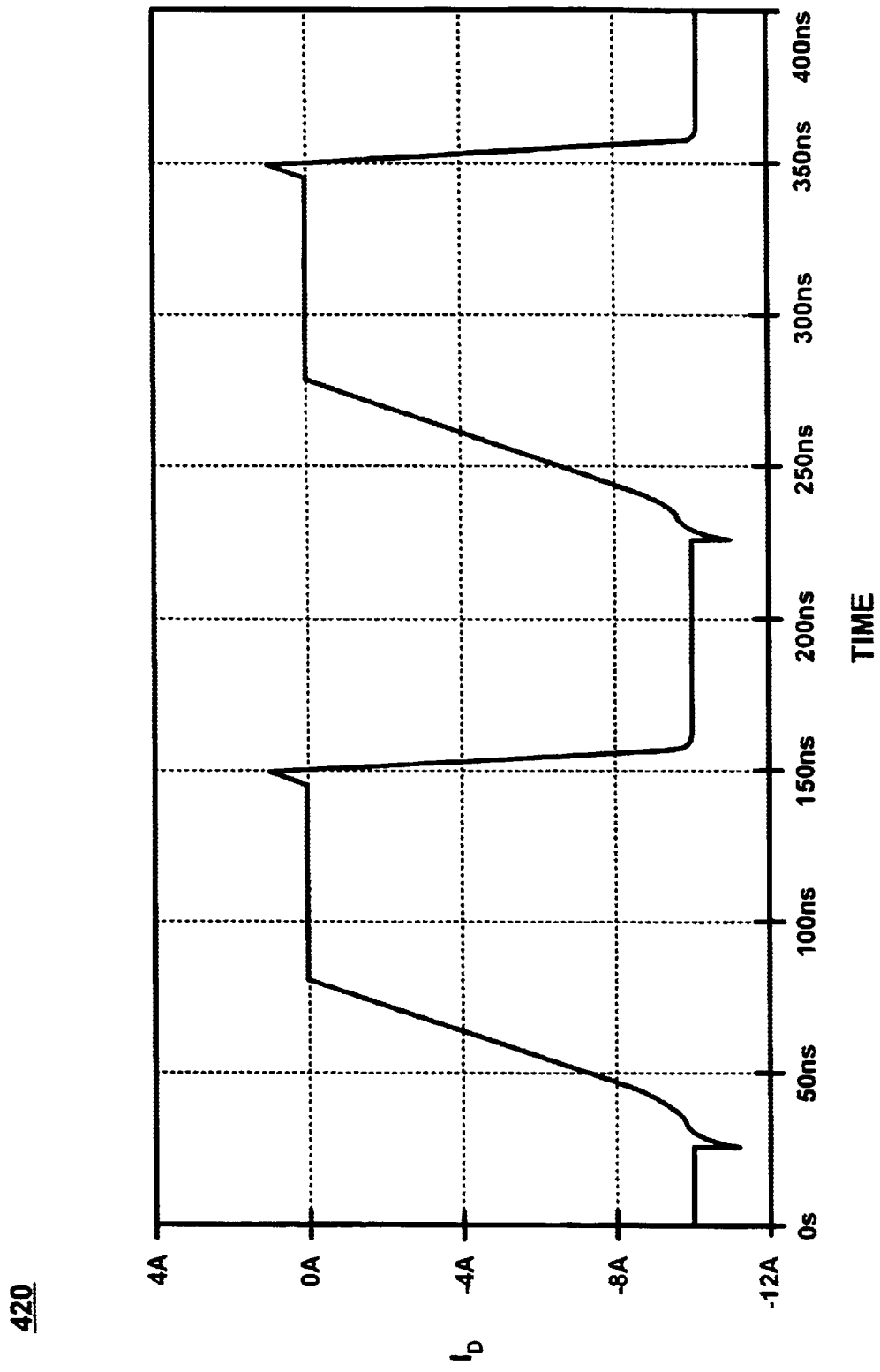
FIG. 4B shows a simulated response for the JFET and MOSFET driver of FIG. 4A with a matching circuit in accordance with an embodiment of the present claimed invention.

FIG. 4B shows a simulated response for the JFET and MOSFET driver of FIG. 4A with an added matching circuit in accordance with an embodiment of the present claimed invention. Table 7 shows a PSpice model for the circuit of FIG. 4B. The general circuit parameters shown in Table 5 are the same as those in Table 4, with the addition of $R_{match}$ with a value of 15 ohms, and $C_{match}$ with a value of 10 nF.

TABLE 7

```
VIN         1 0 PULSE(0V 5V 0 .001uS .001uS .1uS .20uS)
Vdrain      5 0 DC 10
Vcc         3 0 DC  5
Rcc         2 3 1
Rmatch      6 7 15
Rdrain      4 5 1
Cmatch      6 7 10nF
```

TABLE 7-continued

| X1 | 4 7 0 LVTEc219i | ; JFET |
|---|---|---|
| X2 | 1 0 2 6 M7212/EL | ; MOSFET driver |
| .TRAN 1nS .40uS | | |
| .PROBE | | |
| .LIB lvdevs.lib | ; Read models from the library | |
| .END | | |

In comparing the response of FIG. 4A to that of FIG. 4B, it can be seen that the matching circuit enables the MOSFET driver to drive the JFET with a much improved rise time and an overall squarer response.

Figure 5:
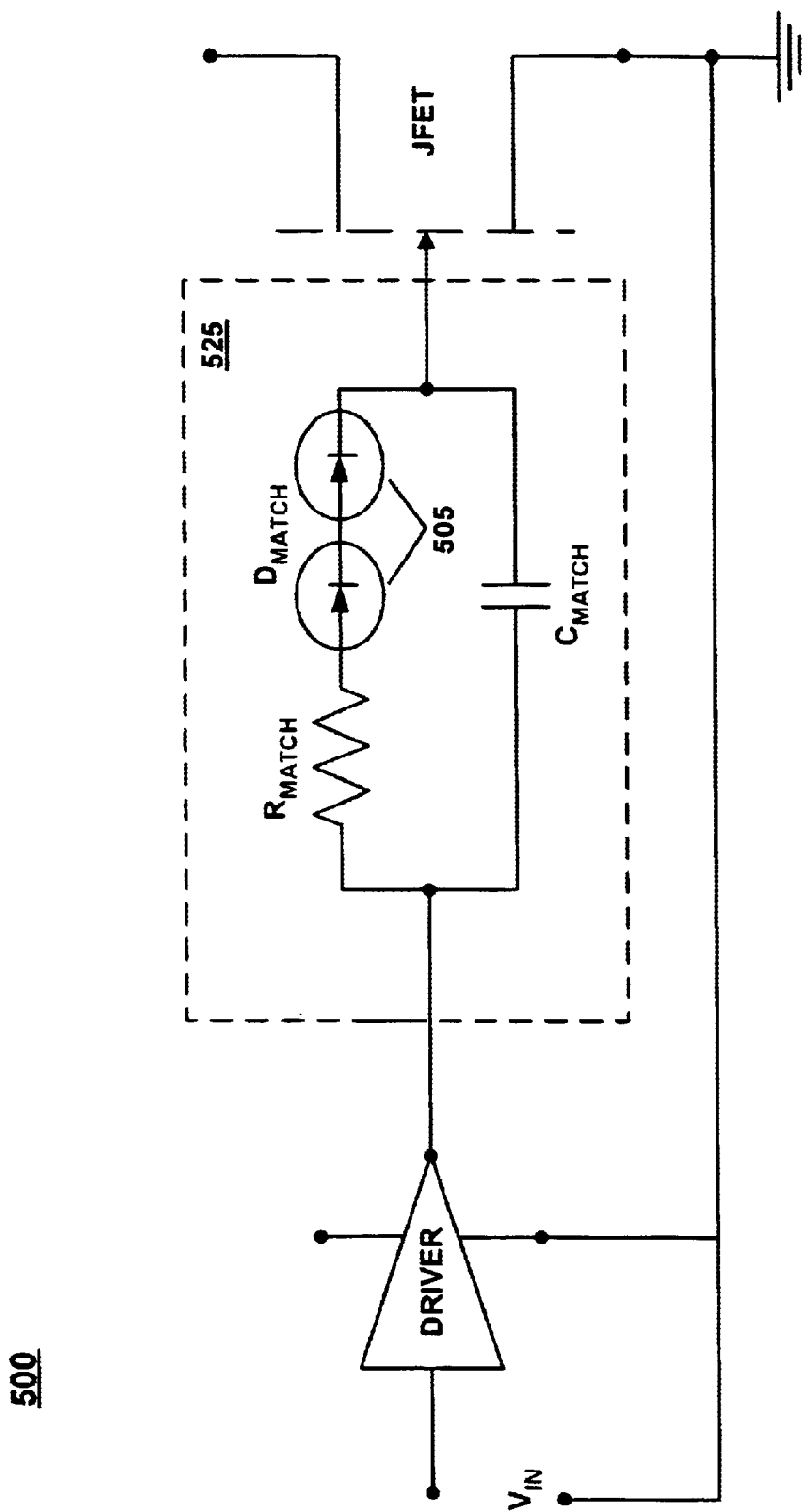
FIG. 5 shows a circuit schematic with a JFET and a MOSFET driver with a matching circuit including a resistor series diode in accordance with an embodiment of the present claimed invention.

FIG. 5 shows a circuit schematic 500 with a JFET and a MOSFET driver with a matching circuit 525 similar to that of FIG. 2B, but further including a resistor series diode 505. For applications that require a negative gate bias, the addition of the resistor series diode 505 provides a nonlinear I-V characteristic that maintains a negative bias that would otherwise discharge (e.g., small RC time constant). Multiple diodes may be used in series in place of a single diode to further shift the I–V characteristic.

MOSFET drivers are designed to drive MOSFETs with electrical characteristics that are fundamentally different from JFETs, and are thus poorly suited to driving JFETs. The matching circuit of the present invention enables MOSFET drivers to be adapted to drive JFETs.

For switching circuits (e.g., buck converters and switching power supplies) operating in the frequency range of 100 kHz to 6 MHz, the typical range of values for $R_{match}$ is between 10 and 200 ohms, and the range of values of for $C_{match}$ is between 1 and 100 nF. The matching circuit of the present invention may be effectively used to match conventional MOSFET drivers to JFETs having a gate grid array structure.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A switching circuit comprising;
   a metal-oxide semiconductor field effect transistor (MOSFET) driver having a signal input, a supply voltage input, and an output;
   an enhancement mode junction field effect transistor (JFET) having a gate, a source and a drain; and
   a matching circuit comprising a capacitor and a resistor coupled in parallel, wherein said matching circuit is coupled to said output and also coupled to said gate.

2. The switching circuit of claim 1, wherein said gate comprises a gate grid array.

3. The switching circuit of claim 1, further comprising a supply voltage coupled to said supply voltage input, wherein said supply voltage is less than 5 volts.

4. The switching circuit of claim 1, further comprising a supply voltage coupled to said supply voltage input, wherein said supply voltage is less than 5 volts.

5. The switching circuit of claim 1, further comprising a signal received at said signal input, wherein said signal has a frequency substantially between 100 kHz and 6 MHz.

6. The switching circuit of claim 1, further comprising a signal received at said signal input, wherein said signal has an amplitude substantially of 5 volts or less.

7. The switching circuit of claim 1, further comprising a signal received at said signal input, wherein said signal has a frequency substantially between 100 kHz and 6 MHz.

8. The switching circuit of claim 1, wherein said capacitor has a capacitance substantially between 1 nF and 100 nF.

9. The switching circuit of claim 1, wherein said resistor has a resistance substantially between 10 ohms and 200 ohms.

10. A matching circuit for coupling a driver circuit optimized for a MOSFET to the gate of an enhancement mode JFET, said matching circuit comprising a capacitor coupled in parallel with a resistor.

11. The matching circuit of claim 10, wherein said capacitor has a capacitance substantially between 1 nF and 100 nF.

12. The matching circuit of claim 10, wherein said resistor has a resistance substantially between 10 ohms and 200 ohms.

13. The matching circuit of claim 10, wherein said enhancement mode JFET comprises a gate grid array.

14. The matching circuit of claim 10, further including at least one diode coupled in series with said resistor.

15. The matching circuit of claim 14, wherein a plurality of diodes are coupled in series with said resistor.

16. A power conditioning circuit comprising:
   a driver circuit optimized for a MOSFET having a signal input and an output;
   an enhancement mode junction field effect transistor (JFET) having a gate, a source and a drain; and
   a matching circuit comprising a capacitor and a resistor coupled in parallel, wherein said matching circuit is coupled to said output and also coupled to said gate.

17. The power conditioning circuit of claim 16, wherein said gate comprises a gate grid array.

18. The power conditioning circuit of claim 16, further comprising a signal received at said signal input, wherein said signal has a frequency substantially between 100 kHz and 6 MHz.

19. The power conditioning circuit of claim 16, further comprising a signal received at said signal input, wherein said signal has an amplitude substantially of 5 volts or less.

20. The power conditioning circuit of claim 16, further comprising a signal received at said signal input, wherein said signal has a frequency substantially between 100 kHz and 6 MHz.

21. The power conditioning circuit of claim 16, wherein said capacitor has a capacitance substantially between 1 nF and 100 nF.

22. The power conditioning circuit of claim 16, wherein said resistor has a resistance substantially between 10 ohms and 200 ohms.

* * * * *